(12) United States Patent
Yim (10) Patent No.: US 7,408,619 B2
(45) Date of Patent: Aug. 5, 2008

(54) PHOTOLITHOGRAPHIC METHOD USING EXPOSURE SYSTEM FOR CONTROLLING VERTICAL CD DIFFERENCE

(75) Inventor: Dong Gyu Yim, Gyunggi-Do (KR)

(73) Assignee: Hynix Semiconductor Inc., Icheon-shi (KR)

(*) Notice: Subject to any disclaimer, the term of this patent is extended or adjusted under 35 U.S.C. 154(b) by 223 days.

(21) Appl. No.: 11/305,063

(22) Filed: Dec. 16, 2005

(65) Prior Publication Data

US 2007/0076185 A1 Apr. 5, 2007

(30) Foreign Application Priority Data

Sep. 30, 2005 (KR) .................. 10-2005-0092375

(51) Int. Cl.
*G03B 27/42* (2006.01)
(52) U.S. Cl. .......................... 355/53; 355/77
(58) Field of Classification Search .......... 355/53, 355/77
See application file for complete search history.

(56) References Cited

U.S. PATENT DOCUMENTS

| 5,726,738 A | 3/1998 | Sohn et al. ............. 355/53 |
| 6,784,976 B2 | 8/2004 | Coston et al. ............. 355/67 |
| 6,809,797 B2 | 10/2004 | Baselmans et al. |
| 6,876,437 B2* | 4/2005 | Kawahara ............. 355/67 |
| 6,958,803 B2* | 10/2005 | Sasaya et al. ............. 355/55 |

FOREIGN PATENT DOCUMENTS

| JP | 09-159909 | 6/1997 |
| KR | 10-1998-0018569 | 6/1998 |
| KR | 2001-0054399 | 7/2001 |
| KR | 10-2002-0077263 A | 10/2002 |

* cited by examiner

*Primary Examiner*—Della J. Rutledge
(74) *Attorney, Agent, or Firm*—Marshall, Gerstein & Borun LLP

(57) ABSTRACT

An exposure system for adjusting the critical dimension difference between vertical patterns and horizontal patterns includes a light source for generating a light beam having a predetermined wavelength, a lens for transforming the shape of the light beam generated from the light source into an elliptical shape extended vertically or horizontally, and a lens system for projecting the elliptical light beam passed through the lens onto a wafer through a recticle.

8 Claims, 5 Drawing Sheets

PHOTOLITHOGRAPHIC METHOD USING EXPOSURE SYSTEM FOR CONTROLLING VERTICAL CD DIFFERENCE

BACKGROUND OF THE INVENTION

1. Field of the Invention

The present invention relates to an exposure system for manufacturing semiconductor devices and photolithographic method using the same, and more particularly, to an exposure system for controlling vertical and horizontal critical dimension (CD) difference and a photolithographic method using the same.

2. Description of the Related Art

Generally, each semiconductor devices such as dynamic random access memories (DRAM) includes plural micro-patterns. Such micro-patterns are formed by a photolithography. In order to form the micro-patterns using the photolithography, firstly, a resist layer is coated on an objected layer to be patterned. Next, by performing the photolithographic process, the solubility in regions of the resist layer is changed. Further, the development process is carried out to remove regions whose solubility is changed or not such that resist layer patterns for exposing a part of the objective layer are formed. After this, the exposed part of the objective layer is removed by the photolithography in which the resist layer patterns serves to as etching mask and the resist layer patterns are stripped so that the objective layer patterns are formed.

Figure 1:
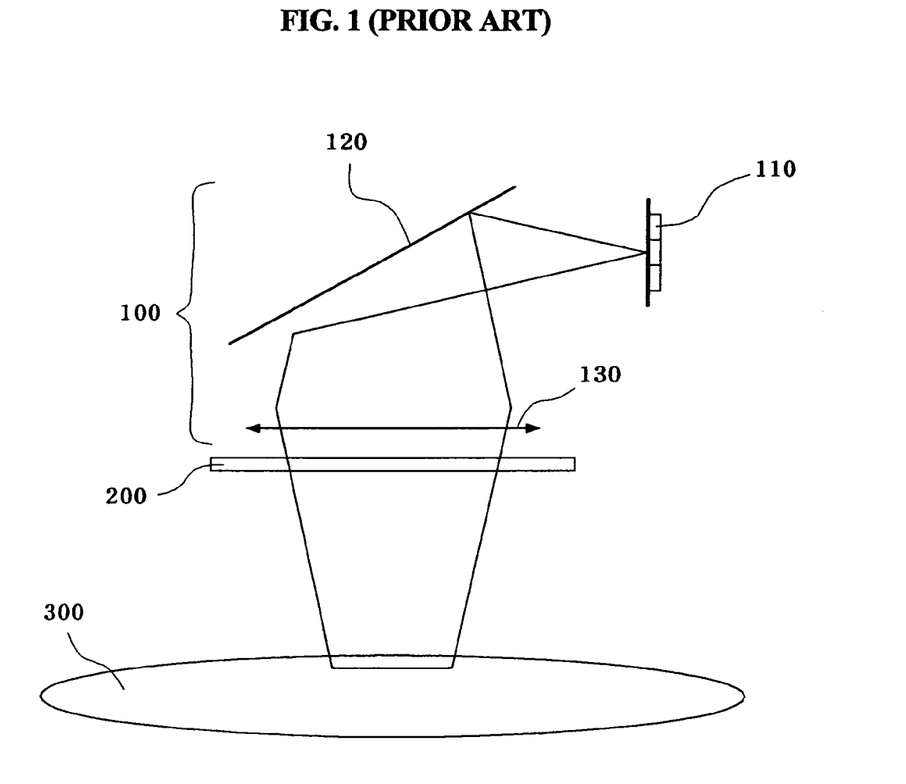
FIG. 1 is a view illustrating an example of conventional exposure systems.

FIG. 1 is a view illustrating an example of conventional exposure systems.

As shown in FIG. 1, the conventional exposure system 100 includes a light source 110, a reflecting mirror 120, and a condense lens 130. The light source 110 emits a light beam of a predetermined wavelength and includes an illuminating system (not shown) although not depicted in the drawings. The reflecting mirror 120 reflects the light beam emitted from the light source 110 and changes the light path toward the condense lens 130. The condense lens 130 concentrates the light beam reflected by the reflecting mirror 120 and sends the concentrated light beam to a recticle 200 such that the concentrated light beam passes through the recticle 200 and is projected onto a wafer 300.

However, during the photolithography, generally, the critical dimension difference (CD) between the vertical patterns and horizontal patterns may be generated due to various factors. Such factors causing the above-described phenomena are the mask manufacturing process, the photolithography equipment itself, and so on. The phenomena are more baldy generated in an asymmetric illumination system that has been frequently used as of late. Generally, there is an isotropic illumination system such as an annular illumination system, a quad illumination system, a crosspole illumination system, and the like having isotropic properties, and an anitotropic illumination system such as a dipole illumination system having anisotropic properties.

In the conventional exposure system, in order to solve the problem caused by the critical dimension between the vertical patterns and the horizontal patterns, simulations or actual test exposures are carried out several times, and using the result of the simulations or the actual test exposures, the mask is manufactured. However, according to the conventional method, manufacturing the mask again increases manufacturing costs, and it takes much time for testing and certifying the mask whenever the mask is manufactured anew, thereby, becoming a major factor for increasing price of the products.

SUMMARY OF THE INVENTION

Therefore, the present invention has been made in view of the above and/or other problems, and it is an object of the present invention to provide an exposure system for controlling the difference between the vertical critical dimensions and the horizontal dimension, which are generated during photolithography.

It is another object of the present invention to provide a photolithographic method using the exposure system.

In accordance with the present invention, the above and other aspects can be accomplished by the provision of an exposure system including a light source for generating a light beam having a predetermined wavelength, a lens for transforming the shape of the light beam generated from the light source into an elliptical shape extended vertically or horizontally, and a lens system for projecting the elliptical light beam passing through the lens onto a wafer through a recticle.

Preferably, the light source includes an illumination system.

The lens includes a cylindrical lens.

Preferably, the cylindrical lens includes a first cylindrical lens disposed in the vertical direction, and a second cylindrical lens disposed in the horizontal direction.

The exposure system further includes a variable zooming system for zooming the first cylindrical lens and the second cylindrical lens in the vertical direction and in the horizontal direction.

Preferably, the lens system ,includes a reflecting mirror for reflecting the light beam from the lens and for changing the light path, and a condense lens for concentrating the light beam having the light path changed by the reflecting mirror.

In accordance with the present invention, the above and other aspects can be accomplished by the provision of an exposure system including a light source for generating a light beam having a predetermined wavelength, a light intercepting layer for truncating vertical and horizontal sides of the shape of the light beam generated from the light source, and a lens system for projecting the light beam having the shape having sides truncated by the light intercepting layer onto a wafer through a recticle.

Preferably, the light intercepting layer includes a pair of first light intercepting layers disposed opposite to each other in the vertical direction, and a pair of second light intercepting layers disposed opposite to each other in a horizontal direction.

The first light intercepting layers and the second light intercepting layers are disposed to move from the center of the light beam in the radial direction such that area of the sides of the light beam to be truncated can adjusted.

The light intercepting layer is disposed opposite to each other in a vertical direction and in a horizontal direction and rotates.

In accordance with the present invention, the above and other aspects can be accomplished by the provision of a photolithographic method including the steps of 1) measuring the critical dimensions of horizontal patterns and vertical patterns having target critical dimensions, 2) obtaining a first critical dimension difference of the horizontal patterns as a difference of a measured critical dimension of the horizontal patterns and the target critical dimension of the horizontal patterns, 3) obtaining a second critical dimension difference of the vertical patterns as a difference of a measured critical dimension of the vertical patterns and the target critical dimension of the vertical patterns, and 4) performing a photolithographic process by transforming the shape of a light beam passing through an illumination system of an exposure system into an elliptical shape horizontally or vertically extended according to the difference between the critical dimension of the vertical patterns and the critical dimension of the horizontal patterns.

Preferably, the step of measuring the critical dimensions of the horizontal patterns and the vertical patterns are carried out after an optical proximity correction, the development process, and an etching process.

The step of performing the photolithographic process is carried out by transforming the shape of the light beam passing through the illumination system into an elliptical shape horizontally extended when the difference between the critical dimension of the vertical patterns and the critical dimension of the horizontal patterns has a negative value.

The step of performing the photolithographic process is carried out by transforming the shape of the light beam passing through the illumination system into an elliptical shape vertically extended when the difference between the critical dimension of the vertical patterns and the critical dimension of the horizontal patterns has a positive value.

In accordance with the present invention, the above and other aspects can be accomplished by provision of a photolithographic method including the steps of 1) measuring critical dimensions of horizontal and vertical patterns having target critical dimensions, 2) obtaining a first critical dimension difference in the horizontal patterns as a difference of a measured critical dimension of the horizontal patterns and the target critical dimension of the horizontal patterns, 3) obtaining a second critical dimension difference of the vertical patterns as a difference of a measured critical dimension of the vertical patterns and the target critical dimension of the vertical patterns, and 4) performing a photolithographic process by transforming the shape of a light beam passing through an illumination system of an exposure system into a shape horizontally or vertically truncated according to the difference between the critical dimension of the vertical patterns and the critical dimension of the horizontal patterns.

Preferably, the step of measuring the critical dimensions of the horizontal patterns and the vertical patterns are carried out after an optical proximity correction, the development process, and an etching process.

The step of performing the photolithographic process is carried out by truncating the vertical sides of the shape of the light beam passing through the illumination system when the difference between the critical dimension of the vertical patterns and the critical dimension of the horizontal patterns has a negative value.

The step of performing the photolithographic process is carried out by truncating the horizontal sides of the shape of the light beam passing through the illumination system when the difference between the critical dimension of the vertical patterns and the critical dimension of the horizontal patterns has a positive value.

BRIEF DESCRIPTION OF THE DRAWINGS

These and/or other aspects and advantages of the present invention will become apparent and more readily appreciated from the following description of the embodiments, taken in conjunction with the accompanying drawings, in which.

DESCRIPTION OF THE PREFERRED EMBODIMENTS

Hereinafter, the preferred embodiments of an exposure system and a photolithographic method using the same according to the present invention will be described in detail with reference to the accompanying drawings. However, although the preferred embodiments of the present invention will be disclosed for illustrative purposes, those skilled in the art will appreciate that various modifications, additions and substitutions are possible, without departing from the scope and spirit of the invention as disclosed in the accompanying claims.

Figure 2:
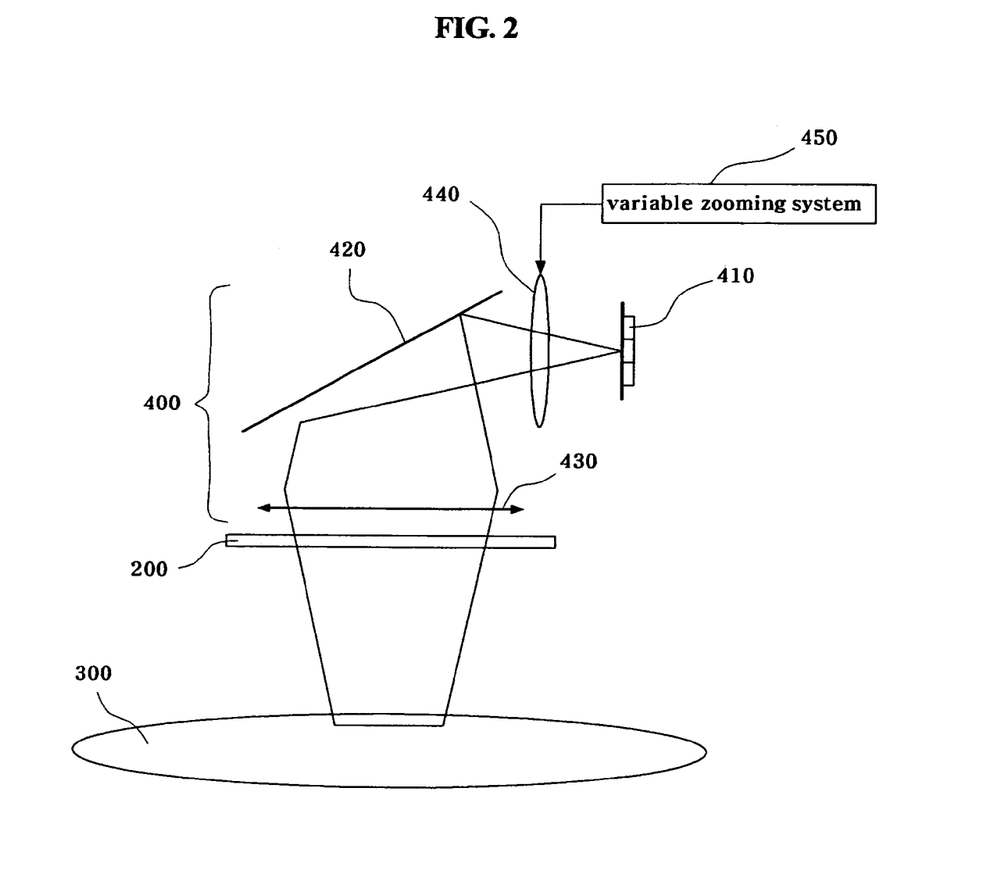
FIG. 2 is a view illustrating an exposure system according to a first preferred embodiment of the present invention.

FIG. 2 is a view illustrating an exposure system according to a first preferred embodiment of the present invention.

Referring to FIG. 2, the exposure system according to the first preferred embodiment of the present invention includes a light source 410, a reflecting mirror 420, a condense lens 430, and a cylindrical lens 440. The light source 410 emits light beam of a predetermined wavelength and includes an illumination system (not shown) although not depicted in the drawings. The illumination system may be a conventional illumination system or a modified illumination system such as an annular illumination system, a quad illumination system, a crosspole illumination system, and a dipole illumination system. The reflecting mirror 420 reflects the light beam emitted from the light source 410 and changes the light path toward the condense lens 430. The condense lens 430 concentrates the light beam reflected by the reflecting mirror 420 and sends the concentrated light beam to a recticle 200 such that the concentrated light beam passes through the recticle 200 and is projected onto a wafer 300.

The cylindrical lens 440 is disposed between the light source 410 and the reflecting mirror 420. The cylindrical lens 440 changes the cross-section of the light beam emitted from the light source 410 into an elliptical cross-section of the light beam. To this end, the cylindrical lens 440 includes a first cylindrical lens disposed in the X-direction and a second cylindrical lens disposed in the Y-direction such that the first cylindrical lens or the second cylindrical lens can be moved. Otherwise, the cylindrical lens 440 is connected to an X-directional and Y-directional variable zooming system 450 such that the cylindrical lens 450 can be zoomed in the X-direction and the Y-direction using the variable zooming system 450.

Figure 3:
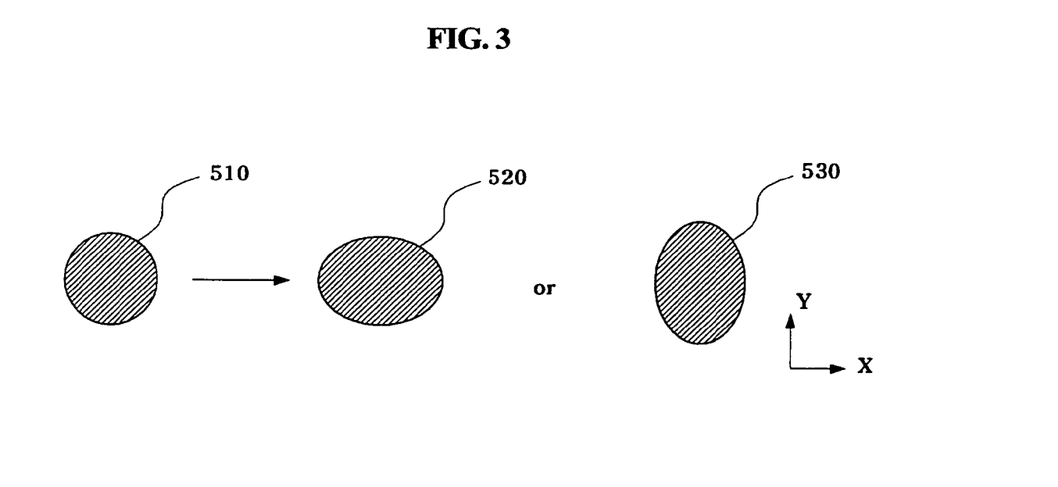
FIG. 3 is a view illustrating shapes of a light beam of a conventional illumination system used in the exposure system of FIG. 2.
Figure 4:
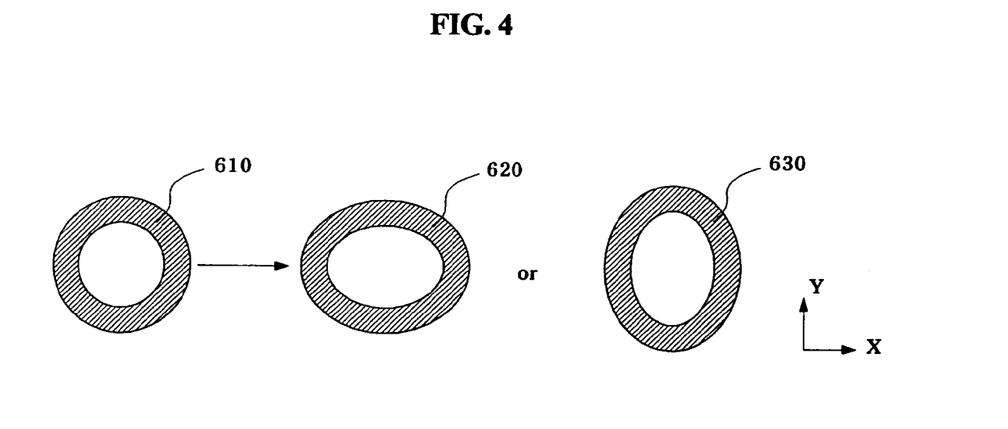
FIG. 4 is a view illustrating shapes of a light beam of an annular illumination system used in the exposure system of FIG. 2.

FIGS. 3 and 4 are views illustrating shapes of a light beam of the illumination system used in the exposure system of FIG. 2, and particularly, FIG. 3 illustrates a case of using a conventional illumination system, and FIG. 4 illustrates a case using an annular illumination system.

Firstly, referring to FIG. 3, a light beam 510, as depicted at the left side of an arrow in the drawing, is a light beam generated in the conventional exposure system when a light source including the convention illumination system is used. The light beam 510 has a substantially circular cross-section. However, in an exposure system according to the preferred embodiment of the present invention as shown in FIG. 2, the light beam 510, depicted at the right side of the arrow in the drawing, is changed into a light beam 520 having an elliptical cross-section that is extended in the X-direction, that is, in the lateral direction, or into a light beam 530 having an elliptical cross-section in the Y, or vertical direction. Whether generating the X-directional extended elliptical light beam 520 or the Y-directional extended elliptical light beam 530 may be determined according to how the critical dimension of the vertical patterns are different from the critical dimension of the horizontal patterns.

Next, referring to FIG. 4, a light beam 610, depicted at the left side of an arrow in the drawing, has a cross-section generated in the conventional exposure system using an annular illumination system. The light beam 610 has a substantially annular cross-section. However, in the exposure system according to the preferred embodiment of the present as shown in FIG. 2, the light beam 610, depicted at the right side of the arrow in the drawing, is changed into a light beam 620 having an annular cross-section extended in the X-direction, that is, in the lateral direction, or into a light beam 630 having an annular cross-section extended in the Y-direction, that is, in the vertical direction. Whether generating the X-directional extended elliptical light beam 620 or the Y-directional extended elliptical light beam 630 may be determined according to how the critical dimension of the vertical patterns are different from the critical dimension of the horizontal patterns.

Generally, the critical dimension difference between the vertical patterns and the horizontal patterns can be obtained by performing photolithography and/or the development process and the etching process using the conventional exposure system. For example, the critical dimension is measured after performing an optical proximity correction with respect to the vertical patterns having a target critical dimension of 240 nm, that is, vertical patterns that are extended in the Y-direction, and the critical dimension is measured after actually performing the development process. Finally, the final critical dimension is measured after performing the etching process using the photoresist layer patterns, fabricated by the final exposure and the development, as an etching mask. Here, the critical dimension difference of the vertical patterns can be obtained by estimating the difference between the measured critical dimension measured after performing the optical proximity correction and the target critical dimension, or by estimating the difference between the critical dimension measured after actually performed the development process and the target critical dimension. However, for a more precise measurement, the critical dimension difference of the vertical patterns is obtained by estimating the difference between the critical dimension measured after performing the etching process and the target critical dimension. The above-described estimation is repeated several times, the critical dimension differences of the vertical patterns obtained by the repeated estimations as described above are averaged to estimate an average of the critical dimension of the vertical patterns. Similarly, the average of the critical dimension differences of the horizontal patterns is obtained in the same manner as the case of the vertical patterns. In other words, the critical dimension differences of the horizontal patterns are obtained after performing the optical proximity correction, the development process, and the etching process.

In the case of measuring the average difference of the critical dimensions of the vertical patterns and the average difference of the critical dimensions of the vertical patterns, the average difference of the critical dimensions of the horizontal patterns may be subtracted from the average difference of the critical dimensions of the vertical patterns. If the difference value is 0 (zero), there is no difference between the critical dimensions of the vertical patterns and the horizontal patterns. However, actually, the difference value has a value different from 0 (zero). In the case of subtracting the average difference of the critical dimensions of the vertical patterns from the average difference of the critical dimensions of the horizontal patterns, if the value is negative, the position of the cylindrical lens 440 is adjusted or the cylindrical lens 440 is zoomed to form the elliptical light beam 520 extended in a lateral direction, that is, in the X-direction, or the annular-shaped light beam 620. On the contrary, if the value is positive, the position of the cylindrical lens 440 is adjusted or the cylindrical lens 440 is zoomed to form the elliptical light beam 530 extended in the vertical direction, that is, in the Y-direction, or the annular-shaped light beam 630.

Figure 5:
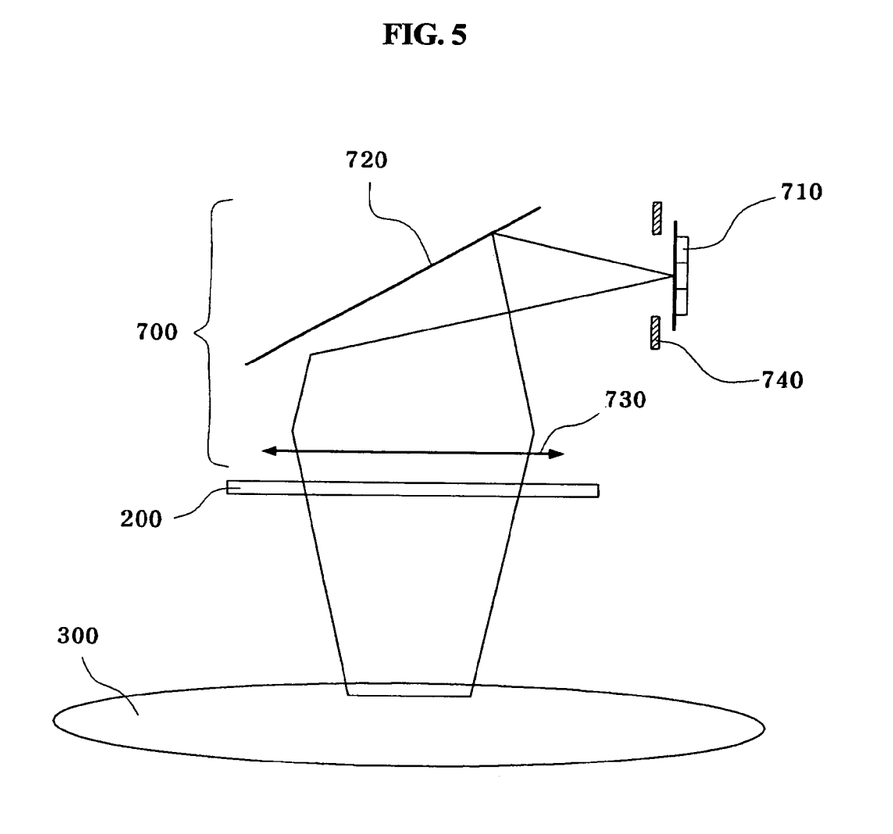
FIG. 5 is a view illustrating an exposure system according another preferred embodiment of the present invention.

FIG. 5 is a view illustrating an exposure system according another preferred embodiment of the present invention.

Referring to FIG. 5, the exposure system according to another preferred embodiment of the present invention includes a light source 710, a reflecting mirror 720, a condense lens 730, and a light intercepting layer 740. The light source 710 emits a light beam of a predetermined wavelength and includes an illumination system (not shown) although not depicted in the drawing. The illumination system may be a conventional illumination system or a modified illumination system such as an annular illumination system, a quad illumination system, a crosspole illumination system, and a dipole illumination system. The reflecting mirror 720 reflects the light beam emitted from the light source 710 and changes the light path toward the condense lens 730. The condense lens 730 concentrates the light beam reflected by the reflecting mirror 720 and sends the concentrated light beam to a recticle 200 such that the concentrated light beam passes through the recticle 200 and is projected onto a wafer 300.

The light intercepting layer 740 is disposed between the light source 710 and the reflecting mirror 720. The light intercepting layer 740 transforms the light beam emitted from the light source 710 such that the cross-section of the light beam is changed into a cross-section whose parts of the upper and lower sides or the left and right sides are truncated. To this end, the light intercepting layer 740 includes first light intercepting layers disposed opposite to each other in the X-direction, and second light intercepting layers disposed opposite to each other in the Y-direction. In this case, the first light intercepting layers and the second light intercepting layers are arranged to move toward or away the center of the light beam. Otherwise, the light intercepting layer 740 is disposed opposite to each other in the X-direction or in the Y-direction and rotates around the light beam such the position of the light intercepting layer 740 can be fixed to selectively dispose opposite to each other in the X-direction or in the Y-direction. In this case, the light intercepting layer 740 may also move toward or away from the center of the light beam.

Figure 6:
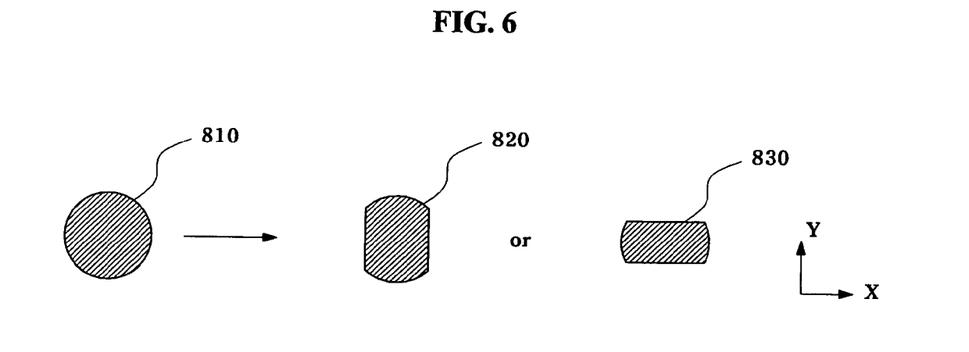
FIG. 6 is a view illustrating shapes of a light beam of a conventional illumination system used in the exposure system of FIG. 5.
Figure 7:
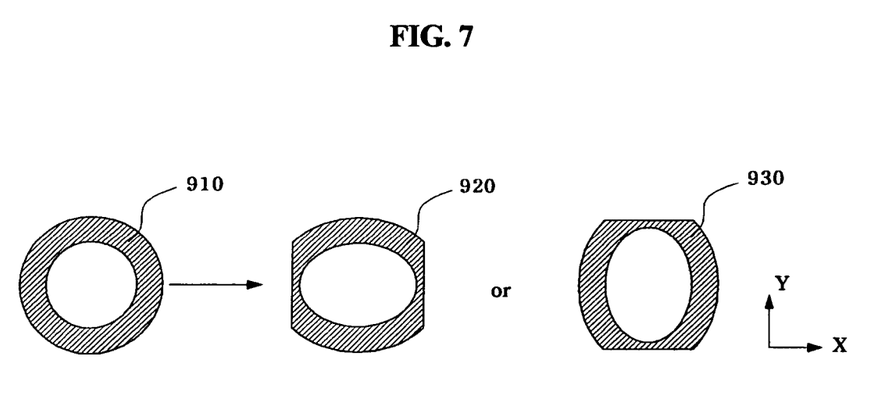
FIG. 7 is a view illustrating shapes of a light beam of an annular illumination system used in the exposure system of FIG. 5.

FIGS. 6 and 7 are views illustrating shapes of a light beam of a conventional illumination system used in the exposure system of FIG. 5, and in detail, FIG. 6 illustrates the case of using a conventional illumination system and FIG. 7 illustrates the case of using an annular illumination system.

Firstly, referring to FIG. 6, a light beam 810, depicted at the left side of an arrow in the drawing, has a cross-section of a light beam generated in the conventional exposure system used in the conventional light source having the conventional illumination system. The light beam 810 has an actual circular cross-section. However, in the exposure system according to the preferred embodiment as described with reference to FIG. 5, as depicted on the right side of the arrow in the drawing, the light beam 810 is transformed into a light beam 820 having a cross-section whose X-directionally truncated sides or into a light beam 830 whose Y-directionally truncated sides. Whether the light beam 820 having the-directionally truncated cross-section or the light beam 830 having a Y-directionally truncated cross-section is generated, is determined according to the critical dimension difference between the vertical patterns and the horizontal patterns.

Next, referring to FIG. 7, a light beam 910 depicted on the left side of an arrow in the drawing has a cross-section of a light beam generated in the conventional exposure system used in the conventional light source having the annular illumination system. The light beam 910 has an actual ring-shaped cross-section. However, in the exposure system according to the preferred embodiment as described with reference to FIG. 5, as depicted at the right side of the arrow in the drawing, the light beam 910 is transformed into a light beam 920 having a cross-section whose X-directionally truncated sides or into a light beam 930 whose Y-directionally truncated sides. Whether the light beam 920 having the-directionally truncated cross-section or the light beam 930 having the Y-directionally truncated cross-section is generated is determined according to the critical dimension difference between the vertical patterns and the horizontal patterns.

Since a method for obtaining the difference between the critical dimensions of the vertical patterns and the critical dimensions of the horizontal patterns is identical to the above-described method, the description for the method will be omitted. In this preferred embodiment, when subtracting the average difference of the critical dimensions of the vertical patterns from the average difference of the critical dimension of the horizontal patterns, if the value is negative, the position of the light intercepting layer 740 is adjusted such that the light beam 830 having the circular cross-section with vertically, that is, Y-directionally truncated sides or the light beam 930 having the ring-shaped cross-section with vertically, that is, Y-directionally truncated sides is generated. On the contrary, if the value is positive, the position of the light intercepting layer 740 is adjusted or the light intercepting layer 740 is zoomed such that the light beam 820 having the circular cross-section with horizontally, that is, X-directional truncated sides or the light beam 920 having the ring-shaped cross-section with horizontally, that is, X-directional truncated sides is generated.

As described above, according to the exposure system and the photolithographic method, the cylindrical lens or the light intercepting layer is disposed between the light source including an illumination system and a lens system such that the shape of a light beam emitted from the light source can be transformed. By adjusting the transformed shape of the light beam, the critical dimension difference of the vertical patterns and the horizontal patterns can be adjusted. As a result, there is no need to fabricate the mask again due to the critical dimension difference of the vertical patterns and the horizontal patterns.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A photolithographic method comprising the steps of:
measuring critical dimensions of horizontal patterns and vertical patterns each having target critical dimensions;
obtaining a first critical dimension difference of the horizontal patterns as a difference of a measured critical dimension of the horizontal patterns and the target critical dimension of the horizontal patterns;
obtaining a second critical dimension difference of the vertical patterns as a difference of a measured critical dimension of the vertical patterns and the target critical dimension of the vertical patterns; and
performing at photolithographic process by transforming the shape of a light beam passing through an illumination system of an exposure system into an elliptical shape horizontally or vertically extended according to the difference between the critical dimension of the vertical patterns and the critical dimension of the horizontal patterns.

2. The photolithographic method as set forth in claim 1, wherein the step of measuring the critical dimensions of the horizontal patterns and the vertical patterns are carried out after an optical proximity correction, the development process, and an etching process.

3. The photolithographic method as set forth in claim 1, wherein the step of performing the photolithographic process is carried out by transforming the shape of the light beam passing through the illumination system into an elliptical shape, horizontally extended when the difference between the critical dimension of the vertical patterns and the critical dimension of the horizontal patterns has a negative value.

4. The photolithographic method as set forth in claim 1, wherein the step of performing the photolithographic process is carried out by transforming the shape of the light beam passing through the illumination system into an elliptical shape vertically extended when the difference between the critical dimension of the vertical patterns and the critical dimension of the horizontal patterns has a positive value.

5. A photolithographic method comprising the steps of:
measuring critical dimensions of horizontal patterns and vertical patterns respectively having target critical dimensions;
obtaining a first critical dimension difference of the horizontal patterns as a difference of a measured critical dimension of the horizontal patterns and the target critical dimension of the horizontal patterns;
obtaining a second critical dimension difference of the vertical patterns as a difference of a measured critical dimension of the vertical patterns and the target critical dimension of the vertical patterns; and
performing a photolithographic process by transforming the shape of a light beam passing through an illumination system of an exposure system into a shape horizontally or vertically truncated according to the difference between the critical dimension of the vertical patterns and the critical dimension of the horizontal patterns.

6. The photolithographic method as set forth in claim 5, wherein the step of measuring the critical dimensions of the horizontal patterns and the vertical patterns are carried out after an optical proximity correction, the development process, and an etching process.

7. The photolithographic method as set forth in claim 5, wherein the step of performing the photolithographic process is carried out by truncating the vertical sides of the shape of the light beam passing through the illumination system when the difference between the critical dimension of the vertical patterns and the critical dimension of the horizontal patterns has a negative value.

8. The photolithographic method as set forth in claim 5, wherein the step of performing the photolithographic process is carried out by truncating the horizontal sides of the shape of the light beam passing through the illumination system when the difference between the critical dimension of the vertical patterns and the critical dimension of the horizontal patterns has a positive value.

* * * * *